(12) United States Patent
Mizuno et al.

(10) Patent No.: US 8,803,064 B2
(45) Date of Patent: Aug. 12, 2014

(54) SIGNAL PROCESSING DEVICE, INCLUDING CHARGE INJECTION CIRCUIT, AND PHOTODETECTION DEVICE

(75) Inventors: Seiichiro Mizuno, Hamamatsu (JP); Hiroo Yamamoto, Hamamatsu (JP); Makoto Kobayashi, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 466 days.

(21) Appl. No.: 13/147,244

(22) PCT Filed: Jan. 29, 2010

(86) PCT No.: PCT/JP2010/051226
§ 371 (c)(1),
(2), (4) Date: Sep. 30, 2011

(87) PCT Pub. No.: WO2010/090135
PCT Pub. Date: Aug. 2, 2012

(65) Prior Publication Data
US 2012/0018621 A1 Jan. 26, 2012

(30) Foreign Application Priority Data
Feb. 3, 2009 (JP) ................................. 2009-022762

(51) Int. Cl.
*H03F 3/08* (2006.01)
*H01L 27/02* (2006.01)
*G01J 1/46* (2006.01)

(52) U.S. Cl.
CPC ............... *H01L 27/0225* (2013.01); *G01J 1/46* (2013.01)
USPC ................ 250/214 A; 250/214 DC; 257/431; 348/300; 348/306; 348/313

(58) Field of Classification Search
CPC .......... H01L 27/0225; G01J 1/46; G01J 5/34; G01J 1/0223; G01J 2001/182
USPC ..... 250/208.2, 214 A, 214.1, 214 R, 214 DC; 348/294, 300, 301, 302, 306, 311, 313, 348/E3.03; 257/431
See application file for complete search history.

(56) References Cited

U.S. PATENT DOCUMENTS 4,888,587 A 12/1989 Kuraishi
5,303,027 A 4/1994 Kuderer et al.
(Continued)

FOREIGN PATENT DOCUMENTS

DE 697 29 767 7/2005
EP 0 297 503 1/1989
(Continued)

*Primary Examiner* — Francis M Legasse, Jr.
(74) *Attorney, Agent, or Firm* — Drinker Biddle & Reath LLP

(57) ABSTRACT

In a signal processing device of an embodiment, an integration circuit accumulates a charge from a photodiode in an integrating capacitor element, and outputs a voltage value according to the amount of charge. A comparator circuit, when the voltage value from the integration circuit has reached a reference value, outputs a saturation signal. A charge injection circuit, in response to the saturation signal, injects an opposite polarity of charge into the integrating capacitor element. A counter circuit performs counting based on the saturation signal. A holding circuit holds the voltage value from the integration circuit. An amplifier circuit outputs a voltage value that is K times (where K>1) larger than the voltage value held by the holding circuit. An A/D converter circuit sets a voltage value that is K times larger than the reference value as the maximum input voltage value, that is, a full-scale value, and outputs a digital value corresponding to the voltage value from the amplifier circuit.

5 Claims, 4 Drawing Sheets

(56) References Cited

U.S. PATENT DOCUMENTS

| | | |
|---|---|---|
| 5,847,594 A | 12/1998 | Mizuno |
| 2004/0118994 A1* | 6/2004 | Mizuno ............... 250/214 R |
| 2005/0209803 A1* | 9/2005 | Yamaguchi ............... 702/72 |
| 2005/0224698 A1* | 10/2005 | Uehara ............... 250/214 R |

FOREIGN PATENT DOCUMENTS

| | | |
|---|---|---|
| EP | 0 519 105 | 12/1992 |
| EP | 0 804 038 | 10/1997 |
| EP | 1 411 332 | 4/2004 |
| ES | 2 076 414 | 11/1995 |
| JP | 64-5226 | 1/1989 |
| JP | 5-215607 | 8/1993 |
| JP | 5-328230 | 12/1993 |
| JP | 9-298690 | 11/1997 |
| JP | 2000-180260 | 6/2000 |
| JP | 2001-141562 | 5/2001 |
| JP | 2003-28713 | 1/2003 |
| JP | 2004-47618 | 2/2004 |
| TW | 200405561 | 4/2004 |
| TW | 238526 | 8/2005 |
| WO | 03/006937 | 1/2003 |
| WO | 2004/008541 | 1/2004 |

* cited by examiner

SIGNAL PROCESSING DEVICE, INCLUDING CHARGE INJECTION CIRCUIT, AND PHOTODETECTION DEVICE

TECHNICAL FIELD

The present invention relates to a signal processing device which outputs an electrical signal having a value according to an amount of charge generated in a photodiode according to an amount of incident light onto the photodiode and a photodetection device including such a signal processing device and photodiode.

BACKGROUND ART

The photodetection device for detecting an amount of incident light includes a photodiode that generates a charge according to an amount of incident light and a signal processing device that outputs an electrical signal having a value according to the amount of the charge generated in this photodiode. As an example of such a photodetection device, a photodetection device disclosed in Patent Literature 1 is known. The photodetection device disclosed in this literature has an A/D conversion function, and can output a digital value according to the amount of incident light.

The photodetection device may be used as, for example, a detecting unit of an X-ray CT apparatus, and a large number of photodiodes may be arranged in an array and covered with a scintillator. Scintillation light is generated when X-rays are made incident on the scintillator, and when the scintillator light is made incident on any of the photodiodes, a charge is generated in the photodiode, and the charge is converted to an electrical signal by the signal processing device.

CITATION LIST

Patent Literature

Patent Literature 1: Japanese Patent Laid-Open No. H05-215607

SUMMARY OF INVENTION

Technical Problem

For such a photodetection device, a higher accuracy as well as a larger number of pixels, a higher speed, and lower power consumption have been required. However, signal processing devices used in conventional photodetection devices including the one disclosed in Patent Literature 1 may not output highly accurate digital values due to the effect of noise.

The present invention has been made in order to solve the above problems, and it is an object of the present invention to provide a signal processing device that can output a highly accurate digital value according to the amount of incident light and a photodetection device including such a signal processing device.

Solution to Problem

A signal processing device according to one embodiment is a signal processing device that outputs an electrical signal having a value according to an amount of charge generated in a photodiode according to an amount of incident light onto said photodiode, and includes (1) an integration circuit including an integrating capacitor element that accumulates a charge output from the photodiode, for outputting a voltage value according to an amount of the charge accumulated in the integrating capacitor element, (2) a comparator circuit for comparing the voltage value output from the integration circuit and input thereto with a predetermined reference value, and when the voltage value has reached the reference value, outputting a saturation signal indicating that fact, (3) a charge injection circuit for, based on the saturation signal output from the comparator circuit, injecting a constant amount of charge having a polarity opposite to that of the charge accumulated in the integrating capacitor element of the integration circuit into the integrating capacitor element, (4) a counter circuit for, based on the saturation signal output from the comparator circuit, counting a number of times that the voltage value output from the integration circuit has reached the reference value, (5) a holding circuit for holding and outputting the voltage value output from the integration circuit, (6) an amplifier circuit for outputting a voltage value that is K times as large as the voltage value held and output by the holding circuit and input thereto (where K>1), and (7) an A/D converter circuit in which a voltage value that is K times as large as the reference value is set a maximum input voltage value, for outputting a digital value corresponding to the voltage value output from the amplifier circuit and input thereto.

This signal processing device is used together with a photodiode. In this signal processing device, a charge generated according to the amount of incident light onto the photodiode is accumulated in the integrating capacitor element of the integration circuit, and a voltage value according to the amount of charge accumulated in this integrating capacitor element is output from the integration circuit. The voltage value output from the integration circuit is input to the comparator circuit, this input voltage value is compared with a predetermined reference value by the comparator circuit, and when the input voltage value has reached the reference value, a saturation signal indicating that fact is output from the comparator circuit. Based on the saturation signal output from this comparator circuit, a constant amount of charge having a polarity opposite to that of the charge to be accumulated in the integrating capacitor element of the integration circuit is injected by the charge injection circuit into the integrating capacitor element. Moreover, based on the saturation signal output from this comparator circuit, the number of times that the voltage value output from the integration circuit has reached the reference value during a constant period of time is counted by the counter circuit. An A/D conversion function is realized by the integration circuit, the comparator circuit, the charge injection circuit, and the counter circuit.

Moreover, a voltage value output from the integration circuit when the above-described constant period of time has ended is held and output by the holding circuit. The voltage value held and output by the holding circuit is amplified by K times by the amplifier circuit, and the amplified voltage value is output to the A/D converter circuit. In the A/D conversion circuit, a voltage value that is K times as large as the reference value in the comparator circuit is set as the maximum input voltage value, the voltage value output from the amplifier circuit is input, and a digital value corresponding to this input voltage value is output. Further, in this signal processing device, the amount of incident light is detected based on the value of the number of times counted by the counter circuit and the digital value output from the A/D converter circuit.

The signal processing device according to the one embodiment may further include a reference value generating circuit for being input with a reference value to set the maximum input voltage value in the A/D converter circuit, and supplying a voltage value which is one K-th as large as this reference value to the comparator circuit as the reference value. The reference value to set the maximum input voltage value in the A/D converter circuit and the reference value to be supplied to the comparator circuit may be generated separately from each other, but the latter can be generated from the former by the reference value generating circuit. This reference value generating circuit may be configured with a resistor divider circuit, for example.

The signal processing device according to the one embodiment may include a first holding circuit and a second holding circuit as the holding circuit, and the amplifier circuit may output a voltage value that is K times as large as a difference between voltage values output from the first holding circuit and the second holding circuit and input thereto. In this case, a voltage value including a signal component and a noise component that is output from the integration circuit is held by the first holding circuit, and a voltage value including only a noise component that is output from the integration circuit is held by the second holding circuit. Then, by the amplifier circuit, a voltage value generated by amplifying a difference between the voltage values output from the first holding circuit and the second holding by K times is output.

The signal processing device according to the one embodiment may include a first holding circuit and a second holding circuit as the holding circuit, and a voltage value output from the integration circuit may be held by the first holding circuit and the second holding circuit alternately, and a process by the integration circuit, the comparator circuit, the charge injection circuit, and the counter circuit and a process by the amplifier circuit and the A/D converter circuit may be performed in parallel As a result of such parallel operations being performed, photodetection can be carried out at high speed.

In the signal processing device according to the one embodiment, one set of the amplifier circuit and the A/D converter circuit may be provided for plural sets each having the integration circuits, the comparator circuits, the charge injection circuits, the counter circuits, and the holding circuits, and voltage values output from the holding circuits of the respective sets may be sequentially input to the amplifier circuit. In this case, imaging is possible by the photodetection device including a photodiode and a signal processing device, and the signal processing device is reduced in circuit scale.

A photodetection device according to one embodiment includes a photodiode for generating a charge according to an amount of incident light, and the signal processing device according to the above-described embodiment for outputting an electrical signal having a value according to an amount of the charge generated in the photodiode.

Advantageous Effects of Invention

The signal processing device and photodetection device according to the present invention can output a highly accurate digital value according to the amount of incident light.

DESCRIPTION OF EMBODIMENTS

Hereinafter, embodiments of the present invention will be described in detail with reference to the accompanying drawings. Also, the same components will be denoted with the same reference symbols in the description of the drawings, and overlapping description will be omitted.

Figure 1:
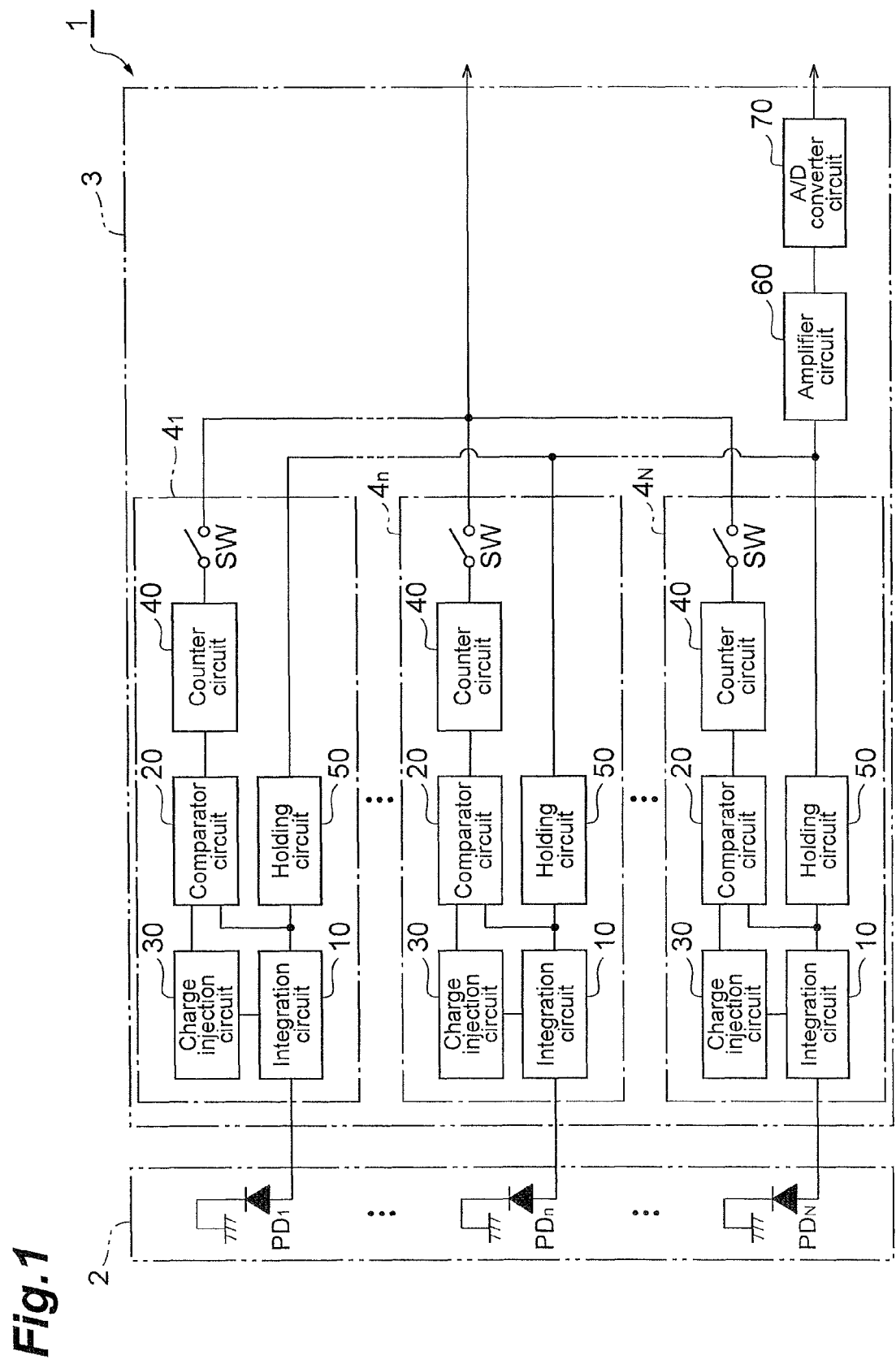
FIG. 1 is a diagram showing a schematic configuration of a photodetection device 1 according to one embodiment.

FIG. 1 is a diagram showing a schematic configuration of a photodetection device 1 according to one embodiment. The photodetection device 1 shown in this figure includes a photodiode array 2 and a signal processing device 3.

The photodiode array 2 includes N photodiodes $PD_1$ to $PD_N$. The N photodiodes $PD_1$ to $PD_N$ have a common configuration. The N photodiodes $PD_1$ to $PD_N$ may be formed on a single semiconductor substrate. Moreover, a light receiving region of each of the N photodiodes $PD_1$ to $PD_N$ may be covered with a scintillator that generates scintillator light in accordance with incidence of energy rays such as X rays. Each photodiode $PD_n$ generates a charge according to the amount of incident light. In addition, N is an integer not less than 1, and n denotes integers not less than 1 and not more than N. Alternatively, N may be an integer not less than 2, and N photodiodes $PD_1$ to $PD_N$ may be arrayed one-dimensionally or two-dimensionally.

The signal processing device 3 outputs an electrical signal (digital signal) having a value according to the amount of charge generated in each photodiode $PD_n$. The signal processing device 3 includes N readout sections $4_1$ to $4_N$, an amplifier circuit 60, and an A/D converter circuit 70. The N readout sections $4_1$ to $4_N$ have a common configuration. Each readout section $4_n$ is provided in association with the photodiode $PD_n$. The signal processing device 3 may be formed on a semiconductor substrate separate from the semiconductor substrate on which the photodiode array 2 is formed. Alternatively, a scintillator may be provided on a back surface of the semiconductor substrate on which the photodiode array 2 is formed, and the front surface of the semiconductor substrate on which the photodiode array 2 is formed and the front surface of the semiconductor substrate on which the signal processing device 3 is formed may be connected to each other via bumps.

Each readout section $4_n$ includes an integration circuit 10, a comparator circuit 20, a charge injection circuit 30, a counter circuit 40, a holding circuit 50, and a switch SW. The integration circuit 10 included in each readout section $4_n$ accumulates a charge output from the corresponding photodiode PD in an integrating capacitor element, and outputs a voltage value according to the amount of the accumulated charge to the comparator circuit 20 and the holding circuit 50. The comparator circuit 20 is input with the voltage value output from the integration circuit 10, compares this input voltage value in size with a predetermined reference value, and when the input voltage value has reached the reference value, outputs a saturation signal indicating that fact to the charge injection circuit 30 and the counter circuit 40.

The charge injection circuit 30, based on the saturation signal output from the comparator circuit 20, injects a constant amount of charge having a polarity opposite to that of the charge accumulated in the integrating capacitor element of the integration circuit 10. The counter circuit 40, based on the saturation signal output from the comparator circuit 20, counts the number of times that the voltage value output from the integration circuit 10 has reached the reference value over a constant period of time. The counter circuit 40 included in each readout section $4_n$ is connected to a common wiring via the switch SW. The holding circuit 50 samples and holds the voltage value output from the integration circuit 10, and outputs the held voltage value to the amplifier circuit 60.

An input terminal of the amplifier circuit 60 is connected to an output terminal of the holding circuit 50 included in each readout section $4_n$. The amplifier circuit 60 is input with the voltage values held and sequentially output by the holding circuits 50 included in respective readout sections $4_n$. The amplifier circuit 60 outputs, to the A/D converter circuit 70, a voltage value generated by amplifying the input voltage value by K times (where K>1). The A/D converter circuit 70 sets a voltage value that is K times as large as the reference value in the comparator circuit 20 as the maximum input voltage value, that is, a full-scale value, is input with the voltage value output from the amplifier circuit 60, and outputs a digital value corresponding to this input voltage value.

Figure 2:
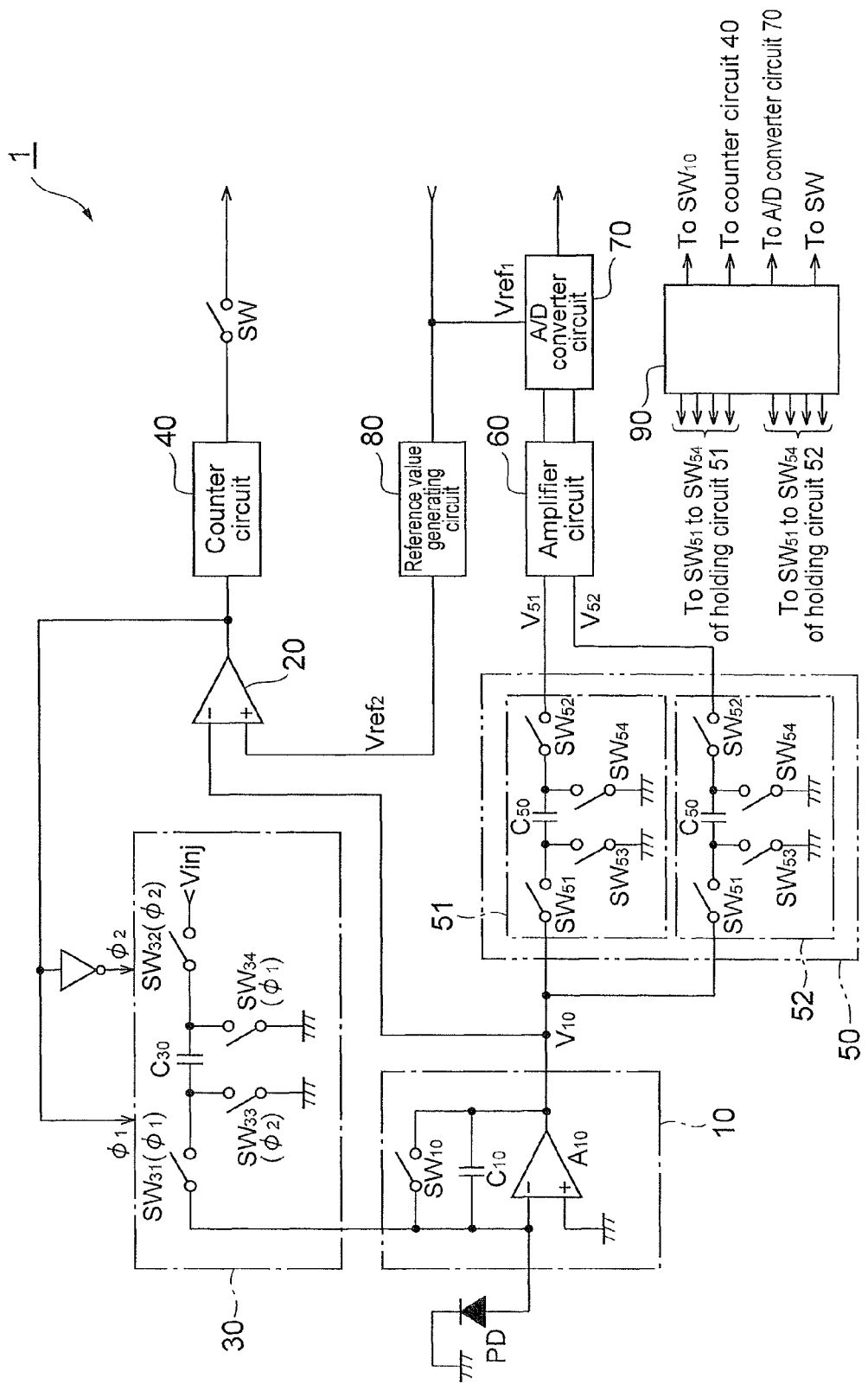
FIG. 2 is a diagram showing a detailed configuration of the photodetection device 1 according to one embodiment.

FIG. 2 is a diagram showing a detailed configuration of the photodetection device 1 according to the one embodiment. In this figure, a set of the photodiode PD and the readout section 4 is shown, and a reference value generating circuit 80 is shown in addition to the amplifier circuit 60 and the A/D converter circuit 70. Here, two holding circuits 51 and 52 are provided as the holding circuit 50.

The integration circuit 10 has an amplifier $A_{10}$, an integrating capacitor element $C_{10}$, and a switch $SW_{10}$. A non-inverting input terminal of the amplifier $A_{10}$ is grounded. An inverting input terminal of the amplifier $A_{10}$ is connected with the photodiode PD. The integrating capacitor element $C_{10}$ and the switch $SW_{10}$ are provided in parallel between the inverting input terminal and an output terminal of the amplifier $A_{10}$. This integration circuit 10, when the switch $SW_{10}$ is closed, discharges the integrating capacitor element $C_{10}$, and outputs a voltage value of a reset level. On the other hand, this integration circuit 10, when the switch $SW_{10}$ is open, accumulates a charge output from the photodiode PD in the integrating capacitor element $C_{10}$, and outputs a voltage value $V_{10}$ according to the amount of charge accumulated in this integrating capacitor element $C_{10}$.

The comparator circuit 20 is input with the voltage value $V_{10}$ output from the integration circuit 10, and compares this voltage value $V_{10}$ in size with a predetermined reference value $V_{ref2}$. Then, the comparator circuit 20, when the voltage value V has reached the reference value $V_{ref2}$, outputs a saturation signal $\phi_1$ indicating that fact.

The charge injection circuit 30 has switches $SW_{31}$ to $SW_{34}$ and a capacitor element $C_{30}$. The switch $SW_{31}$, the capacitor element $C_{30}$, and the switch $SW_{32}$ are connected in order, the other end of the switch $SW_{31}$ is connected to the inverting input terminal of the amplifier $A_{10}$ of the integration circuit 10, and the other end of the switch $SW_{32}$ is connected to a reference potential $V_{inj}$. A connection point between the switch $SW_{31}$ and the capacitor element $C_{30}$ is grounded via the switch $SW_{33}$. A connection point between the switch $SW_{32}$ and the capacitor element $C_{30}$ is grounded via the switch $SW_{34}$. Each of the switches $SW_{31}$ and $SW_{34}$ opens and closes based on the saturation signal $\phi_1$ output from the comparator circuit 20. Each of the switches $SW_{32}$ and $SW_{33}$ opens and closes based on a logically inverted signal $\phi_2$ of the saturation signal $\phi_1$ output from the comparator circuit 20. That is, this charge injection circuit 30, based on the saturation signal $\phi_1$ output from the comparator circuit 20, injects a constant amount of charge having a polarity opposite to that of the charge accumulated in the integrating capacitor element $C_{10}$ of the integration circuit 10.

The counter circuit 40, based on the saturation signal $\phi_1$ output from the comparator circuit 20, counts the number of times that the voltage value V output from the integration circuit 10 has reached the reference value $V_{ref2}$ over a constant period of time, and outputs this counted value as a digital value.

The integration circuit 10, the comparator circuit 20, the charge injection circuit 30, and the counter circuit 40 have an A/D conversion function. That is, an absolute value of the amount of charge that is output from the photodiode PD and accumulated in the integrating capacitor element $C_{10}$ of the integration circuit 10 within the constant period of time is provided as $Q_0$, and an absolute value of the amount of charge that is injected into the integrating capacitor element $C_{10}$ of the integration circuit 10 by the charge injection circuit 30 based on the saturation signal $\phi_1$ output from the comparator circuit 20 is provided as $Q_1$. In this case, the counted value by the counter circuit 40 is an integer value for which a value obtained by dividing $Q_0$ by $Q_1$ is rounded down to a whole number. Moreover, a voltage value to be output from the integration circuit 10 when the above-described constant period of time has ended is a voltage value according to a remaining value obtained by subtracting the above-described integer value from the value obtained by dividing $Q_0$ by $Q_1$.

The holding circuit 51 and the holding circuit 52 have a common configuration. Each of the holding circuit 51 and the holding circuit 52 includes switches $SW_{51}$ to $SW_{54}$ and a capacitor element $C_{50}$. The switch $SW_{51}$, the capacitor element $C_{50}$, and the switch $SW_{52}$ are connected in order, the other end of the switch $SW_{51}$ is connected to the output terminal of the amplifier $A_{10}$, and the other end of the switch $SW_{52}$ is connected to the input terminal of the amplifier circuit 60. A connection point between the switch $SW_{51}$ and the capacitor element $C_{50}$ is grounded via the switch $SW_{53}$. A connection point between the switch $SW_{52}$ and the capacitor element $C_{50}$ is grounded via the switch $SW_{54}$.

In each of the holding circuit 51 and the holding circuit 52, the switches $SW_{51}$ and $SW_{54}$ open and close simultaneously. The switches $SW_{52}$ and $SW_{53}$ are opened and closed simultaneously. When the switches $SW_{51}$ and $SW_{54}$ change into an open state from a closed state, an output voltage value from the integration circuit 10 is held in the capacitor element $C_{50}$ immediately before that. When the switches $SW_{52}$ and $SW_{53}$ open, the voltage value held in the capacitor element $C_{50}$ is output to the amplifier circuit 60.

The holding circuit 51 samples and holds the voltage value output from the integration circuit 10 when the constant period during which the counter circuit 40 performs counting has ended, and outputs the held voltage value to the amplifier circuit 60. On the other hand, the holding circuit 52 samples and holds the voltage value of a reset level output from the integration circuit 10 when the switch $SW_{10}$ of the integration circuit 10 is closed, and outputs the held voltage value to the amplifier circuit 60.

The amplifier circuit 60 is input with a voltage value $V_{51}$ output from the holding circuit 51 and input with a voltage value $V_{52}$ output from the holding circuit 52, and outputs a voltage value $(K(V_{51}-V_{52}))$ generated by amplifying a difference between these two input voltage values by K times, to the A/D converter circuit 70. The voltage value $V_{51}$ output from the holding circuit 51 is, of a voltage value including a signal component and a noise component, a remaining voltage value when A/D conversion by the A/D conversion function composed of the integration circuit 10, the comparator circuit 20, the charge injection circuit 30, and the counter circuit 40 was performed. The voltage value $V_{52}$ output from the holding circuit 52 does not include a signal component and includes only a noise component. Therefore, the voltage value to be output from the amplifier circuit 60 represents a value after the noise component is removed from the above-described remaining voltage value.

As in the foregoing, the amplifier circuit 60 is input with voltage values held and output by the holding circuits 51 and 52, and outputs a voltage value generated by amplifying the difference between these two input voltage values by K times, to the A/D converter circuit 70. Moreover, the A/D converter circuit 70 sets a voltage value that is K times as large as the reference value in the comparator circuit 20 as the maximum input voltage value, is input with the voltage value output from the amplifier circuit 60, and outputs a digital value corresponding to this input voltage value. Accordingly, the reference value generating circuit 80 is input with a reference value $V_{ref1}$ to set the maximum input voltage value in the A/D converter circuit 70, and supplies a voltage value ($V_{ref1}$/K) that is one K-th of this reference value $V_{ref1}$ as the reference value $V_{ref2}$ to the comparator circuit 20. The reference value generating circuit 80 can be formed of a resistor divider circuit.

In addition, the photodetection device 1 according to the present embodiment may further include a control section 90. The control section 90 controls at predetermined timings an opening and closing operation of the switch $SW_{10}$ in the integration circuit 10, a counting operation in the counter circuit 40, an opening and closing operation of the switches $SW_{51}$ to $SW_{54}$ in the holding circuits 51 and 52, an opening and closing operation of the switch SW, and an A/D conversion operation in the A/D converter circuit 70. That is, as shown in FIG. 2, the control section 90 supplies control signals to the switch $SW_{10}$, the counter circuit 40, the switches $SW_{51}$ to $SW_{54}$ of the holding circuit 51, the switches $SW_{51}$ to $SW_{54}$ of the holding circuit 52, and the switch SW of each of the readout sections $4_1$ to $4_N$, and the A/D converter circuit 70 to control the operations of these elements at predetermined timings.

Figure 3:
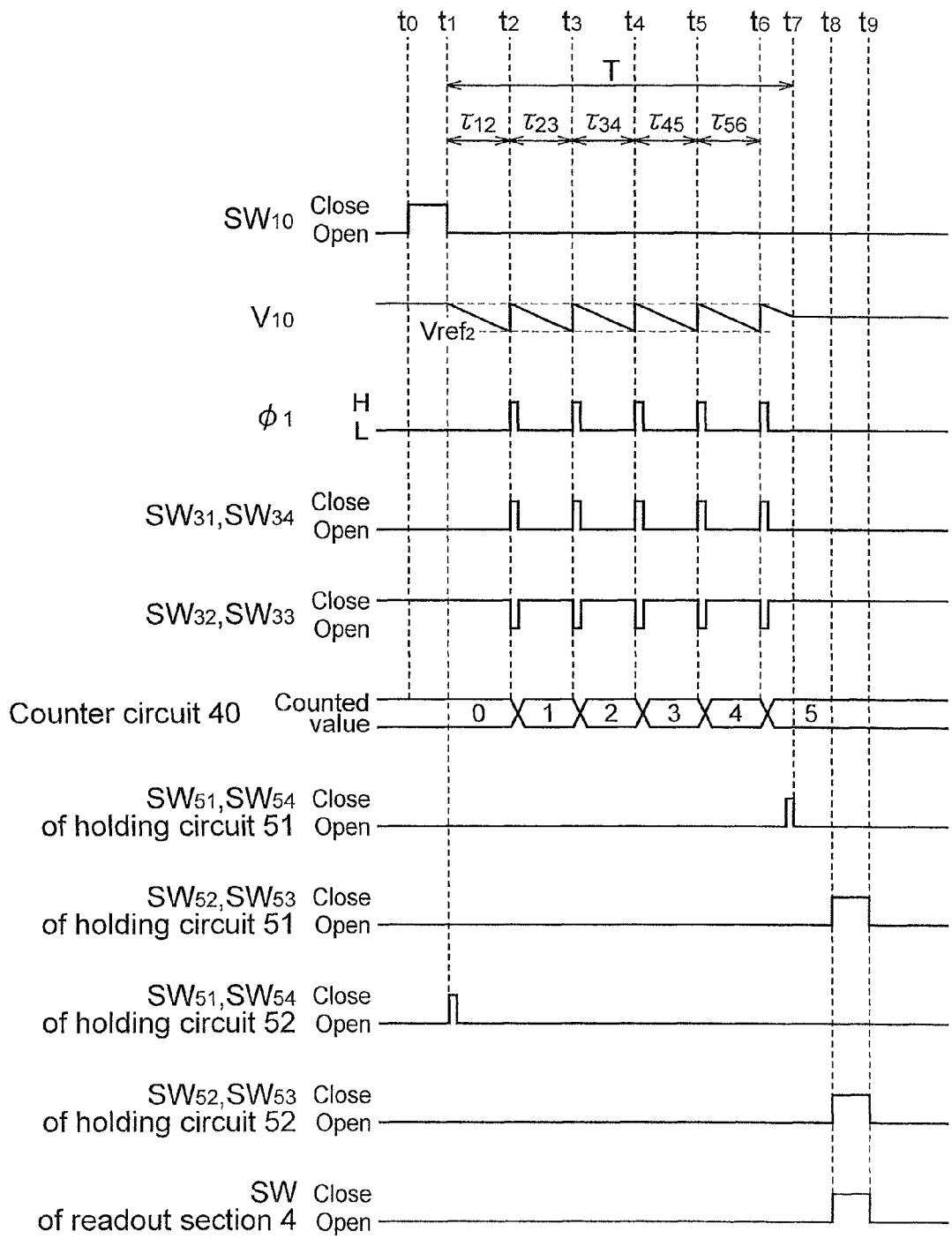
FIG. 3 is a flowchart explaining the operation of the photodetection device 1 according to one embodiment.

Next, the operation of the photodetection device 1 according to the present embodiment will be described. FIG. 3 is a flowchart explaining the operation of the photodetection device 1 according to the one embodiment.

At time $t_0$, the switch $SW_{10}$ of the integration circuit 10 closes to discharge the integrating capacitor element $C_{10}$, and the voltage value $V_{10}$ that is output from the integration circuit 10 reaches the reset level. At this time, the saturation signal $\phi_1$ that is output from the comparator circuit 20 is at logic level L, each of the switches $SW_{31}$ to $SW_{34}$ of the charge injection circuit 30 is open, each of the switches $SW_{32}$ to $SW_{33}$ of the charge injection circuit 30 is closed, and the counted value in the counter circuit 40 has been initialized to a value 0.

At time $t_1$, the switch $SW_{10}$ of the integration circuit 10 opens, a charge generated in the photodiode PD is accumulated in the integrating capacitor element $C_{10}$, and the voltage value $V_{10}$ according to the amount of the accumulated charge is output from the integration circuit 10. The voltage value $V_{10}$ that is output from the integration circuit 10 is compared with the reference value $V_{ref2}$ by the comparator circuit 20.

At time $t_2$, when the voltage value $V_{10}$ output from the integration circuit 10 reaches the reference value $V_{ref2}$, the saturation signal $\phi_1$ that is output from the comparator circuit 20 changes from logic level L to logic level H, and in accordance therewith, each of the switches $SW_{31}$ and $SW_{34}$ of the charge injection circuit 30 closes, and each of the switches $SW_{32}$ and $SW_{33}$ thereof opens.

Then, if the amount of charge $Q_{10}$ ($=C_{10} \cdot V_{ref2}$) that has been accumulated in the integrating capacitor element $C_{10}$ when the voltage value $V_{10}$ output from the integration circuit 10 reached the reference value $V_{ref2}$ and the amount of charge $Q_{30}$ ($=C_{30} \cdot V_{inj}$) that has been accumulated in the capacitor element $C_{30}$ of the charge injection circuit 30 until then are equal to each other, the charge that has been accumulated in the capacitor element $C_{30}$ of the charge injection circuit 30 is injected into the integrating capacitor element $C_{10}$ of the integration circuit 10, and the amount of charge accumulation in the integrating capacitor element $C_{10}$ is reset.

Thereby, the voltage value $V_{10}$ that is output from the integration circuit 10 once reaches the reset level, and the voltage value $V_{10}$ according to the amount of charge accumulated thereafter is output from the integration circuit 10. Moreover, immediately, the saturation signal $\phi_1$ that is output from the comparator circuit 20 changes to logic level L, and in accordance therewith, each of the switches $SW_{31}$ and $SW_{34}$ of the charge injection circuit 30 opens, and each of the switches $SW_{32}$ and $SW_{33}$ thereof closes.

Also at each of time $t_3$, time $t_4$, time $t_5$, and time $t_6$, the foregoing series of operations is performed. Here, the time period $\tau_{12}$ from time $t_1$ to time $t_2$, the time period $\tau_{23}$ from time $t_2$ to time $t_3$, the time period $\tau_{34}$ from time $t_3$ to time $t_4$, the time period $\tau_{45}$ from time $t_4$ to time $t_5$, and the time period $\tau_{56}$ from time $t_5$ to time $t_6$ are equal to each other if the amount of incident light onto the photodiode PD during each of these period is constant.

Such repeated operations are performed until time $t_7$ ($=t_1+T$) where a constant time period T elapses since time $t_1$ where an integrating operation in the integration circuit 10 was started. The time period from time $t_6$ to time $t_7$ is shorter than the above-described time $\tau_{12}$ and the like. During this constant time period T, the number of times the saturation signal $\phi_1$ that is output from the comparator circuit 20 changes from logic level L to logic level H is counted by the counter circuit 40. That is, the counted value in the counter circuit 40 takes a value 1 at time $t_2$, takes a value 2 at time $t_3$, takes a value 3 at time $t_4$, takes a value 4 at time $t_5$, and takes a value 5 at time $t_6$. That is, an A/D conversion function is realized by the integration circuit 10, the comparator circuit 20, the charge injection circuit 30, and the counter circuit 40.

The switches $SW_{51}$ and $SW_{54}$ of the holding circuit 51 close before time $t_7$, and the switches $SW_{51}$ and $SW_{54}$ of the holding circuit 51 open at time $t_7$, and consequently, the value $V_{51}$ of the voltage value $V_{10}$ being output from the integration circuit 10 immediately before time $t_7$ is sampled and held by the holding circuit 51. Moreover, the switches $SW_{51}$ and $SW_{54}$ of the holding circuit 52 close at time $t_1$, and the switches $SW_{51}$ and $SW_{54}$ of the holding circuit 52 open immediately after time $t_1$, and consequently, the value $V_{52}$ of noise (kTC noise) generated as a result of the switch $SW_{10}$ of the integration circuit 10 opening at time $t_1$ and output from the integration circuit 10 is sampled and held by the holding circuit 52.

During time $t_8$ to time $t_9$ after time $t_7$, as a result of the switches $SW_{52}$ and $SW_{53}$ of each of the holding circuit 51 and holding circuit 52 being closed, the voltage value $V_{51}$ that has been held by the holding circuit 51 and the voltage value $V_{52}$ that has been held by the holding circuit 52 are input to the amplifier circuit 60, and a voltage value ($K(V_{51}-V_{52})$) that is K times as large as a difference between these two input voltage values is output from the amplifier circuit 60. The voltage value output from the amplifier circuit 60 is input to the A/D converter circuit 70, and a digital value corresponding to this input voltage value is output from the A/D converter circuit 70.

Moreover, the counting operation in the counter circuit 40 is stopped after time $t_7$, and the counted value at time $t_7$ is held by the counter circuit 40. Then, during time $t_8$ to time $t_9$, the switch SW of the readout section $4_n$ is closed, and the counted value that has been held by the counter circuit 40 of the readout section $4_n$ is output through the switch SW.

Among the above operations, the operations during time $t_0$ to time $t_7$ are simultaneously performed in parallel in the N readout sections $4_1$ to $4_N$. On the other hand, the operations after time t7 are performed sequentially for the N readout sections $4_1$ to $4_N$. In such a manner as above, a first digital value that is a counted value by the counter circuit 40 and a second digital value that is an A/D conversion result by the A/D converter circuit 70 are obtained, sequentially in terms of each the N readout sections $4_1$ to $4_N$, as output values in response to the amount of incident light onto the photodiode PD.

As can be understood from the foregoing operations, the second digital value is subordinate to the first digital value. Where the first digital value is represented by M1 bits and the second digital value is represented by M2 bits, a digital value to be output from this photodetection device 1 is represented as (M1+M2) bits of data $D_{M1+M2-1}$ to $D_0$. Among these bits, upper M1 bits of data $D_{M1+M2-1}$ to $D_{M2}$ correspond to the first digital value, and lower M2 bits of data $D_{M2-1}$ to $D_0$ correspond to the second digital value.

Therefore, in the photodetection device 1 according to the present embodiment, the value of the amount of incident light onto the photodiode PD is converted to the first digital value by the A/D conversion function which is realized by the integration circuit 10, the comparator circuit 20, the charge injection circuit 30, and the counter circuit 40, and a remaining value which could not be completely A/D-converted by this A/D conversion function is converted to the second digital value by the A/D converter circuit 70. Therefore, in this photodetection device 1, the amount of incident light can be detected in a short time with a wide dynamic range. Moreover, in this photodetection device 1, when a plurality of photodiodes PD are arrayed one-dimensionally or two-dimensionally, an incident light image can be imaged with a wide dynamic range.

Moreover, in the photodetection device 1 according to the present embodiment, the amplifier circuit 60 is input with the voltage value $V_{51}$ output from the holding circuit 51 and input with the voltage value $V_{52}$ output from the holding circuit 52, and outputs a voltage value ($K(V_{51}-V_{52})$) for which a difference between these two input voltage values is amplified by K times (provided that K>1) to the A/D converter circuit 70. Then, the A/D converter circuit 70 sets a voltage value that is K times as large as the reference value $V_{ref2}$ in the comparator circuit 20 as the maximum input voltage value, is input with the voltage value output from the amplifier circuit 60, and outputs the second digital value (lower M2 bits of data $D_{M2-1}$ to $D_0$) corresponding to this voltage value. Thereby, since noise generated in an A/D conversion operation in the A/D converter circuit 70 is suppressed to one K-th, the digital value ($D_{M1+M2-1}$ to $D_0$) to be output from the photodetection device 1 can be of high accuracy. Thus, the photodetection device 1 according to the present embodiment can output a highly accurate digital value according to the amount of incident light.

In the configuration described up to now, the two holding circuits 51 and 52 are provided, and a value for which a difference between voltage values output from each of the holding circuit 51 and holding circuit 52 is amplified by K times is output from the amplifier circuit 60. Thereby, the voltage value that is output from the amplifier circuit 60 represents a value after a noise component generated in the integration circuit 10 is removed. When such a noise component removal is unnecessary, the holding circuit 52 may not be provided.

Figure 4:
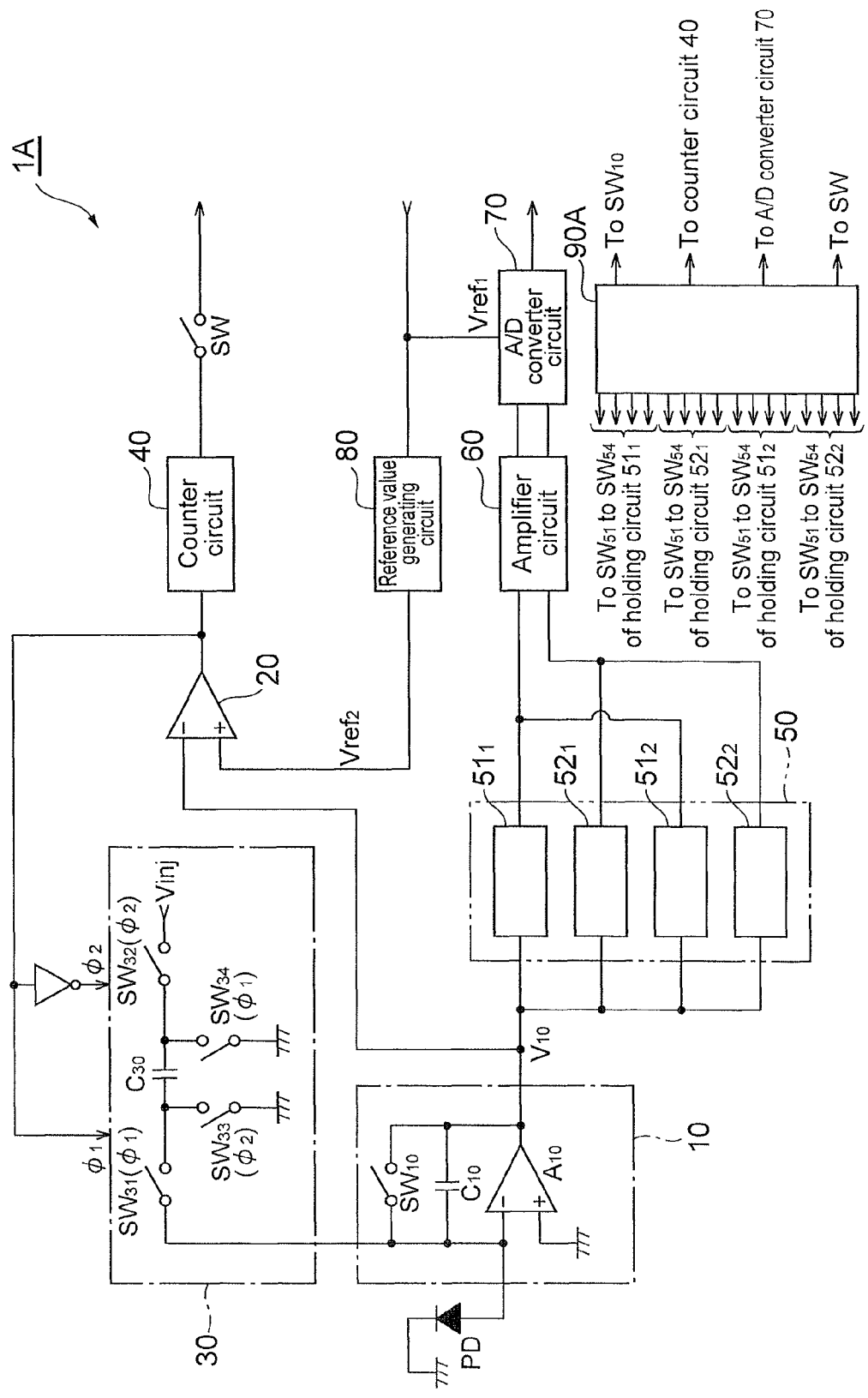
FIG. 4 is a diagram showing a detailed configuration of a photodetection device 1A according to another embodiment.

Moreover, as shown in FIG. 4, four holding circuits $51_1$, $52_1$, $51_2$, and $52_2$ may be provided as the holding circuit 50. FIG. 4 is a diagram showing a detailed configuration of a photodetection device 1A according to another embodiment. Each of the four holding circuits $51_1$, $52_1$, $51_2$, and $52_2$ has the same configuration as that of the holding circuits 51 and 52 in FIG. 2 already described.

Each of the holding circuits $51_1$ and $51_2$, similar to the holding circuit 51 in FIG. 2, holds and outputs a voltage value (including a signal component and a noise component) output from the integration circuit 10. Each of the holding circuits $52_1$ and $52_2$, similar to the holding circuit 52 in FIG. 2, holds and outputs a voltage value (including only a noise component) output from the integration circuit 10. A first set of the holding circuits $51_1$ and $52_1$ and a second set of the holding circuits $51_2$ and $52_2$ perform the same operation, but are different in operation timing from each other.

That is, it is assumed that, in the photodetection device 1A, in each of a plurality of consecutive periods of time, an A/D conversion operation by the integration circuit 10, the comparator circuit 20, the charge injection circuit 30, and the counter circuit 40 is performed, and a counted value (first digital value) is output from the counter circuit 40. In a certain first period of time out of the consecutive periods of time, while a sampling operation of voltage values by the first set of holding circuits $51_1$ and $52_1$ is performed, the voltage values that have been held by the second set of holding circuits $51_2$ and $52_2$ are amplified by the amplifier circuit 60 and A/D-converted by the A/D converter circuit 70, and a second digital value is output. In a second period of time following this first period of time, while a sampling operation of voltage values by the second set of holding circuits $51_2$ and $52_2$ is performed, the voltage values that have been held by the first set of holding circuits $51_1$ and $52_1$ are amplified by the amplifier circuit 60 and A/D-converted by the A/D converter circuit 70, and a second digital value is output.

This photodetection device 1A can be controlled by a control section 90A. The control section 90A, as shown in FIG. 4, supplies control signals to the switch $SW_{10}$, the counter circuit 40, the switches $SW_{51}$ to $SW_{54}$ of the holding circuit $51_1$, the switches $SW_{51}$ to $SW_{54}$ of the holding circuit $52_1$, the switches $SW_{51}$ to $SW_{54}$ of the holding circuit $51_2$, the switches $SW_{51}$ to $SW_{54}$ of the holding circuit $52_2$, and the switch SW of each of the readout sections $4_1$ to $4_N$, and the A/D converter circuit to control the operations of these at predetermined timings.

Thus, in the photodetection device 1A, the voltage values output from the integration circuit 10 are sampled and held alternately by the first set of holding circuits $51_1$ and $52_1$ and the second set of holding circuits $51_2$ and $52_2$, and a process by the integration circuit 10, the comparator circuit 20, the charge injection circuit 30, and the counter circuit 40 and a process by the amplifier circuit 60 and the A/D converter circuit 70 are performed in parallel. Therefore, this photodetection device 1A can perform photodetection or imaging at high speed, in addition to providing the same effects as those of the aforementioned photodetection device 1.

In addition, also in the photodetection device 1A, when it is unnecessary to remove the noise component generated in the integration circuit 10, the holding circuits $52_1$ and $52_2$ may not be provided.

REFERENCE SIGNS LIST 1 photodetection device, 2 . . . photodiode array, 3 . . . signal processing device, $4_1$ to $4_N$ . . . readout sections, 10 . . . integration circuit, 20 . . . comparator circuit, 30 . . .

charge injection circuit, 40 . . . counter circuit, 50 to 52 . . . holding circuits, 60 . . . amplifier circuit, 70 . . . A/D converter circuit, 80 . . . reference value generating circuit.

The invention claimed is:

1. A signal processing device that outputs an electrical signal having a value according to an amount of charge generated in a photodiode according to an amount of incident light onto the photodiode, comprising:

an integration circuit including an integration capacitor element that accumulates a charge output from the photodiode, for outputting a voltage value according to an amount of the charge accumulated in the integrating capacitor element;

a comparator circuit for comparing the voltage value output from the integration circuit and input thereto with a predetermined reference value, and when the voltage value has reached the reference value, outputting a saturation signal indicating that fact;

a charge injection circuit for, based on the saturation signal output from the comparator circuit, injecting a constant amount of charge having a polarity opposite to that of the charge accumulated in the integrating capacitor element of the integration circuit into the integrating capacitor element;

a counter circuit for, based on the saturation signal output from the comparator circuit, counting a number of times that the voltage value output from the integration circuit has reached the reference value;

a holding circuit for holding and outputting the voltage value output from the integration circuit;

an amplifier circuit for outputting a voltage value that is K times as large as the voltage value held and output by the holding circuit and input thereto (where K>1);

an A/D converter circuit in which a voltage value that is K times as large as the reference value is set as a maximum input voltage value, for outputting a digital value corresponding to the voltage value output from the amplifier circuit and input thereto; and further comprising a reference value generating circuit for being input with a reference value to set the maximum input voltage value in the A/D converter circuit, and supplying a voltage value one K-th as large as this reference value to the comparator circuit as the reference value.

2. The signal processing device according to claim 1, comprising a first holding circuit and a second holding circuit as the holding circuit, wherein the amplifier circuit outputs a voltage value that is K times as large as a difference between voltage values input from the first holding circuit and the second holding circuit and input thereto.

3. The signal processing device according to claim 1, comprising a first holding circuit and a second holding circuit as the holding circuit, wherein a voltage value output from the integration circuit is held by the first holding circuit and the second holding circuit alternately, and a process by the integration circuit, the comparator circuit, the charge injection circuit, and the counter circuit and a process by the amplifier circuit and the A/D converter circuit are performed in parallel.

4. The signal processing device according to claim 1, wherein one set of the amplifier circuit and the A/D converter circuit is provided for plural sets each having the integration circuits, the comparator circuits, the charge injection circuits, the counter circuits, and the holding circuits, and voltage values output from the holding circuits of the respective sets are sequentially input to the amplifier circuit.

5. A photodetection device comprising:

a photodiode for generating a charge according to an amount of incident light; and the signal processing device according to claim 1 for outputting an electrical signal having a value according to an amount of the charge generated in the photodiode.

* * * * *

UNITED STATES PATENT AND TRADEMARK OFFICE
CERTIFICATE OF CORRECTION

PATENT NO. : 8,803,064 B2
APPLICATION NO. : 13/147244
DATED : August 12, 2014
INVENTOR(S) : Seiichiro Mizuno et al.

Page 1 of 1

It is certified that error appears in the above-identified patent and that said Letters Patent is hereby corrected as shown below:

Title Page, item (87) "PCT Pub. Date"

change "Aug. 12, 2012" to --Aug. 12, 2010--

Signed and Sealed this
Sixteenth Day of December, 2014

Michelle K. Lee
*Deputy Director of the United States Patent and Trademark Office*